United States Patent
Hu (10) Patent No.: US 7,608,929 B2
(45) Date of Patent: *Oct. 27, 2009

(54) ELECTRICAL CONNECTOR STRUCTURE OF CIRCUIT BOARD AND METHOD FOR FABRICATING THE SAME

(75) Inventor: Wen-Hung Hu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 402 days.

This patent is subject to a terminal disclaimer.

(21) Appl. No.: 11/370,532

(22) Filed: Mar. 8, 2006

(65) Prior Publication Data

US 2006/0204650 A1    Sep. 14, 2006

(30) Foreign Application Priority Data

Mar. 9, 2005    (TW) .............................. 94107080 A (51) Int. Cl.
*H01L 23/48* (2006.01)
*B32B 15/00* (2006.01)
(52) U.S. Cl. ..................... 257/779; 257/780; 257/781; 428/209
(58) Field of Classification Search ................. 428/209; 257/779–781
See application file for complete search history.

(56) References Cited

U.S. PATENT DOCUMENTS

| 4,893,404 | A | * | 1/1990 | Shirahata et al. | ............... 29/852 |
| 5,869,899 | A | * | 2/1999 | Arledge et al. | ............... 257/738 |
| 6,198,169 | B1 | * | 3/2001 | Kobayashi et al. | .......... 257/780 |
| 7,151,050 | B2 | * | 12/2006 | Hsu et al. | .................. 438/614 |

* cited by examiner

*Primary Examiner*—Cathy Lam
(74) *Attorney, Agent, or Firm*—Sawyer Law Group, P.C.

(57) ABSTRACT

An electrical connector structure of circuit board and a method for fabricating the same are proposed. A circuit board having a conductive layer is formed with a first resist layer and a second resist layer thereon, so as to form electrical connection pads and metal bumps on the electrical connection pads. The first and second resist layers are formed with openings therein at positions corresponding to the electrical connection pads and metal bumps, and the exposed conductive layer is removed. An adhesive layer is formed to cover the exposed surfaces of the electrical connection pads and the metal bumps. Then, the second resist layer, the first resist layer and the conductive layer covered by the first resist layer are removed. Later, an insulating protective layer is formed on a surface of the circuit board, and thinned to expose a portion of the adhesive layer, such that electrical connectors of the circuit board are fabricated.

5 Claims, 8 Drawing Sheets

ELECTRICAL CONNECTOR STRUCTURE OF CIRCUIT BOARD AND METHOD FOR FABRICATING THE SAME

CROSS-REFERENCE TO RELATED APPLICATION

This application claims benefit under 35 USC 119 of Taiwan Application No. 094107080, filed on Mar. 9, 2005.

FIELD OF THE INVENTION

The present invention relates to electrical connection structures of semiconductor chips and methods of fabricating the same, and more particularly, relates to an electrical connection structure of a semiconductor chip and a method of fabricating the same.

BACKGROUND OF THE INVENTION

The flip chip packaging technology was introduced by IBM in the early 1960s, and this technology differs from the wire bonding technology in that the electrical connectivity between the semiconductor chip and the substrate is achieved by the solder bump instead of the conventional wires. The main advantage of the flip chip packaging technology lies in its capability of elevating packaging density, thus the size of the packaged components are reduced; on the other hand, the flip chip packaging technology does not require wires of longer length, and hence the electrical functionality can be improved. As a result, the industry has been employing high-temperature soldering on ceramic substrates for years, and this technology is termed as control-collapse chip connection or 4C technology. Because the demand for semiconductor components of high-density, high-speed, low-cost has increased dramatically, and a trend that calls for smaller electronic products has emerged; it has become common to place the flip chip components on a low-cost organic circuit board (for example, a printed circuit board or a substrate board), then followed by the filling of epoxy underfill resin underneath the chip in order to minimize the thermal stress resulted from the differences in thermal expansion between silicon chip and organic circuit board structure, and the phenomenon has grown exponentially.

In the current flip chip packaging technology, the surface of semiconductor integrated circuit chip is disposed an electrode pad thereof, and its corresponding connecting pad is disposed on the organic circuit board; a solder bump or other conductive solder materials is filled between the chip and the circuit board, so that the chip is disposed on the circuit board with its electrical connecting side facing downwards. The solder bump or the conductive adhesive material used in this technology provides for the electrical input and output, as well as the mechanical connection between the chip and the circuit board.

Moreover, when the circuit board and the semiconductor chip are to be packaged, a plurality of solder balls are required to be implanted on the bottom surface of the circuit board, so that it is possible for the circuit board to electrically connect to external electronic devices. In order to allow the solder balls to connect to the circuit board effectively, the electrical connection pads of the circuit board that are to be used for the disposition of solder balls must be formed with the soldering material for connecting the solder balls first.

Currently, the method that is most commonly used to form soldering material on the electrical connection pads of the circuit board is the stencil printing technology. However, the developmental trend of miniaturization for semiconductor chip is driving changes in the semiconductor packaging technology, in order to allow the ever-shrinking chips to have more input and output terminals. But the change also shrinks the total area of carried components in a chip, which in turn increases the quantity of electrical connection pads on the carried components; as a result, the demands for the development of chip can only be satisfied by shrinking the size and the pitch of electrical connection pads. But the shrinking of electrical connection pads also makes the openings on the stencil used in stencil printing technology smaller as well. As a result, the smaller openings on stencil not only increases the cost for producing the stencil, which is resulted from difficulty in stencil production; but also hampers the later production process because the smaller opening on the stencil can be impervious to the soldering material. Furthermore, apart from the requirement of accurate size of stencil in order to ensure the precision in the shaping of soldering material; there are the problems of the number of times the stencil has been used and cleaned. Since the soldering material is viscous, it can stick to the inner wall of openings in the stencil and accumulate as the stencil is used to print many times, and this can give rise to incorrect quantity and shape of soldering material from the design specification when the stencil is used next time. Therefore, when the stencil is put to actual usage, it must be cleaned after a certain times of printing, otherwise problems like conflicting shape and size of soldering material can arise and result in the production process being impeded, which lowers its reliability.

To solve the forgoing problem, a method for fabricating a conductive bump on the electrical connection pad of the circuit board via electroplating has been employed.

FIGS. 1A to 1K, are cross-sectional views of a convention electrical connection structure of circuit board fabricated via electroplating and in accordance with the prior-art.

Figure 1A:
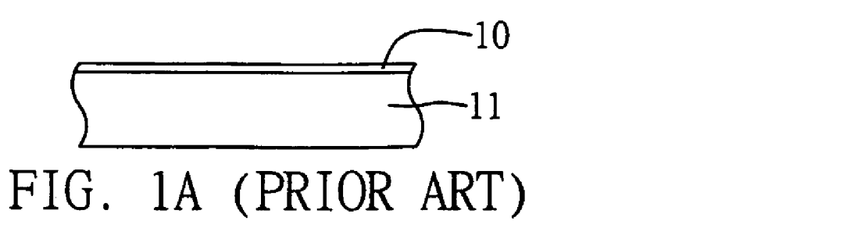
FIGS. 1A to 1K (PRIOR ART) are cross-sectional views of a conventional electrical connection structure of a circuit board.
Figure 1B:
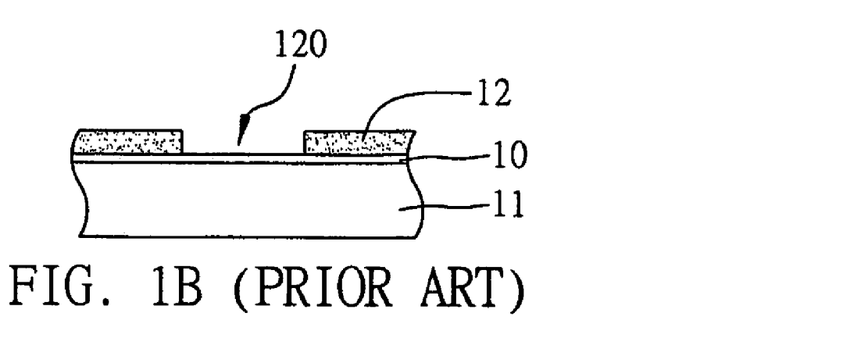
Figure 1C:
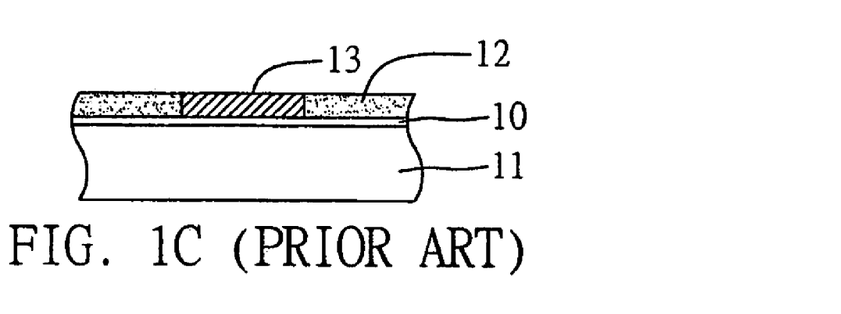
Figure 1D:
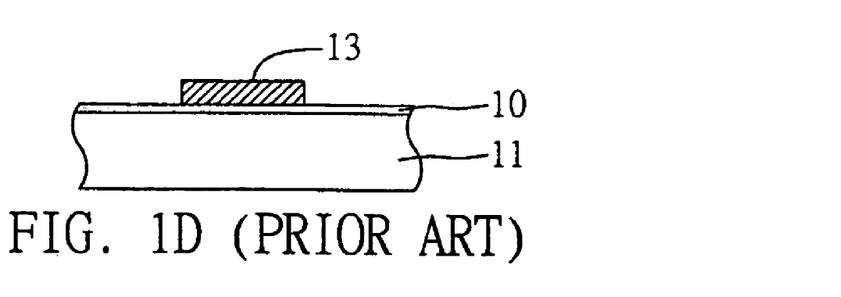
Figure 1E:
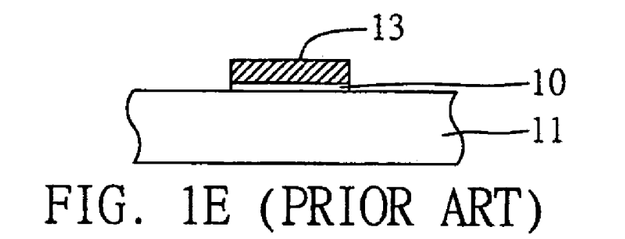
Figure 1F:
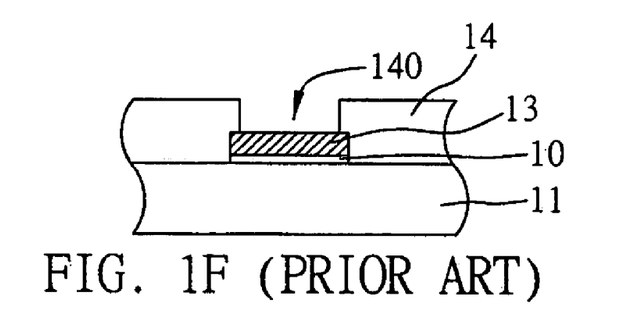
Figure 1G:
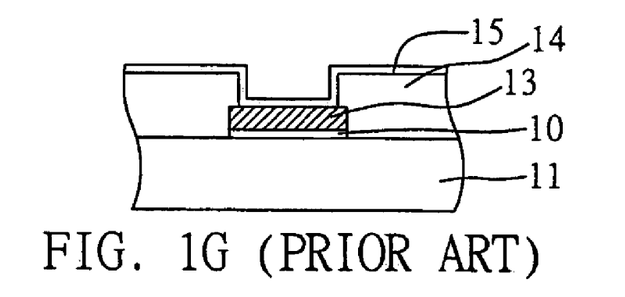
Figure 1H:
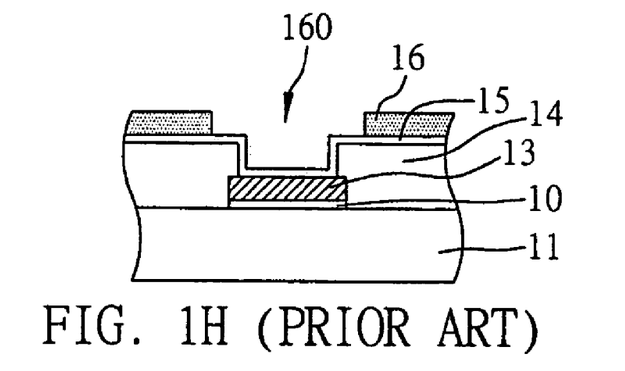
Figure 1I:
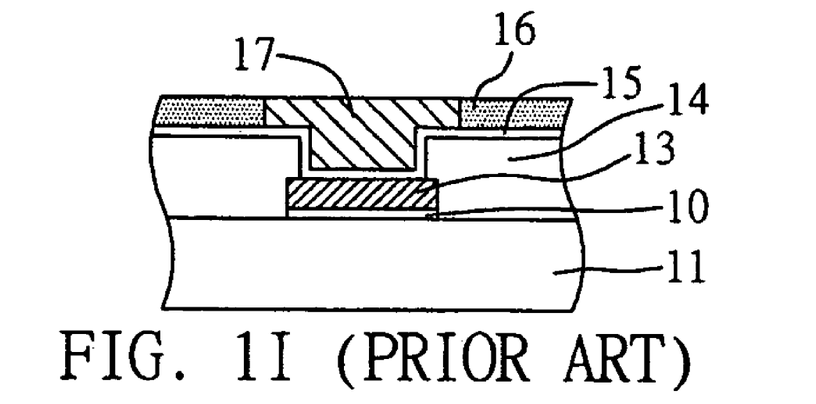
Figure 1J:
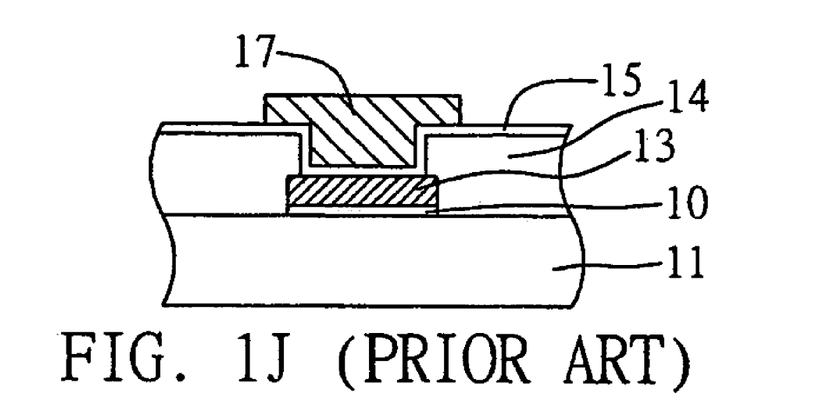
Figure 1K:
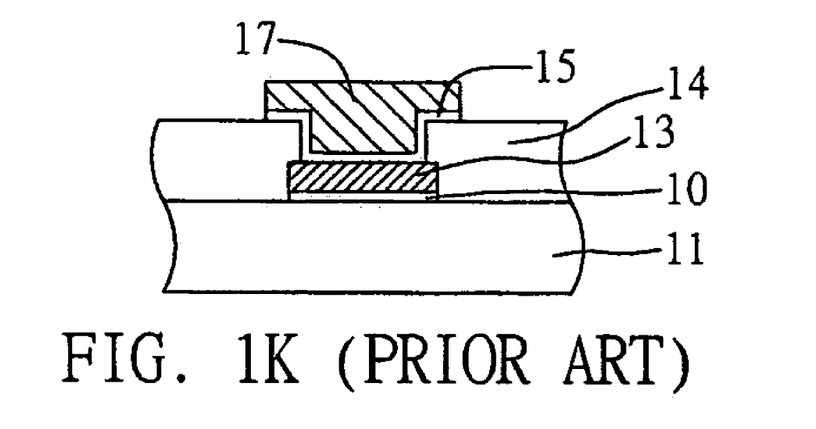

As shown in FIG. 1A, a first conductive layer 10 is formed on an insulating layer 11 of the circuit board. The first conductive layer 10 can be formed by chemical deposition or sputtering, and is also referred as a seed layer. Referring to FIG. 1B, a first resist layer 12 is formed on surface of the first conductive layer 10, and a plurality of first openings 120 are formed on the first resist layer 12 via patterning processes such as exposure and developing, so as to expose the conductive layer 10. Generally, the first resist layer 12 is made of photosensitive material such as a dry film. Referring to FIG. 1C, an electrical connection pad 13 is formed in the first openings 120 via electroplating. Referring to FIG. 1D the first resist layer 12 is removed by stripping. Referring to FIG. 1E, the first conductive layer 10 is removed by chemical etching. Referring to FIG. 1F, a solder mask layer 14 is formed over the surface of the circuit board. The solder mask layer 14 is made of photosensitive materials. Further, a plurality of second openings 140 are formed at positions corresponding to the electrical connection pads 13 via patterning processes such as exposure and developing, so as to expose the electrical connection pads 13. Referring to FIG. 1G, a second conductive layer 15 is formed by chemical deposition or sputtering of the solder mask layer 14 and surfaces of exposed portion of electrical connection pads 13, wherein the material and property of the second conductive layer 15 is as same as that of the first conductive layer 10. Referring to FIG. 1H, a second resist layer 16 is formed on the surface of the second conductive layer 15, wherein the material and property of the second resist layer 16 is as same as that of the first resist layer 12. Accordingly, a plurality of third openings 160 are formed at positions corresponding to the electrical connection pads 13 via patterning processes such as exposure and developing, so as to expose a portion of the second conductive layer 15. Referring to FIG. 1I, a metal bump 17 is formed in the third openings 160 via electroplating; and generally the metal bump 17 is made of solder materials which can form an electrical connecter of the circuit board for connecting a semiconductor chip or a passive component. Referring to FIG. 1J, the second resist layer 16 is removed by stripping. Referring to FIG. 1K, the exposed portion of the second conductive layer 15 is removed via chemical etching.

Although problem of stencil printing technology known in prior-art can be solved via the forgoing method of electroplating, the size of the openings of the solder mask layer and electroplating resist layer are formed via exposure and developing, which have to be performed precisely and accurately. As the range of alignment accuracy of a general machine is approximately 20 µm-30 µm, it is difficult to align the openings of the electroplated resist layer with the center of the opening of the solder mask layer. Accordingly, the size of the openings has to be increased in order to reduce the difficulty of alignment. Nevertheless, the requirement of forming fine pitches between the electrical connection pads cannot be met if the openings of the electroplated resist layer are enlarged.

Therefore, the conductive bumps cannot be formed on the electrical connection pads having fine pitches therebetween by the electroplating process. Moreover, if the conductive bumps are to be formed with fine pitches therebetween, the insulating layer and resist layer have to be aligned more accurately, resulting to a increase of complexity of fabrication, fabrication time and difficulty of alignment. Furthermore, in the processes of the aforementioned fabrication, the solder mask layer is formed first on the circuit board. Then a patterned resist layer is formed on the solder mask layer. Subsequently, an electroplating process is performed to form solder materials. Later, the resist layer is formed on the solder mask layer. However, due to foregoing fabrication processes, the volume of the overall structure will become too thick, and thus increases difficulty of electroplating process. Moreover, if the solder material is formed directly on the electrical connection pads in the openings of the solder mask layer, the heights of the solder materials of the electrical connection pads are difficult to control, and thus results in forming rough surfaces with uneven height of conductive bumps and making a serious impact on reliability of forming electrical connections between circuit boards and external electrical elements subsequently.

SUMMARY OF THE INVENTION

In light of the above prior-art drawbacks, a primary objective of the present invention is to provide an electrical connection structure of a semiconductor chip and a method of fabricating the same, so as to avoid restrictions on the size of conductive bumps and the pitches formed therebetween, and difficulties of alignment when performing the conventional electroplating process, and reduce requirement of exposure accuracy.

Another objective of the present invention is to provide an electrical connection structure of a semiconductor chip and a method of fabricating the same, so as to prevent forming uneven height of conductive bumps on a surface of the circuit board, which will affect the reliability of the electrical connecting process of circuit boards and external electronic devices A further objective of the present invention is to provide an electrical connection structure of a semiconductor chip and a method of fabricating the same, so as to form conductive bump structures for electrically connecting to the external devices, on electrical connection pads having fine pitch formed therebetween, of a circuit board.

In accordance with the foregoing and other objectives, the present invention proposes a method for fabricating an electrical connector structure of a circuit board which comprises the steps of: forming a conductive layer on an insulating layer of the circuit board; forming a first resist layer on the conductive layer, and forming a plurality of first openings in the first resist layer to expose a portion of the conductive layer; forming electrical connection pads in the first openings; forming a second resist layer over the electrical connection pads and the first resist layer, and forming a plurality of second openings in the second resist layer at positions corresponding to the electrical connection pads to expose the electrical connection pads via the second openings; forming metal bumps in the second openings; forming third openings in the first resist layer and the second resist layer at positions corresponding to the electrical connection pads and the metal bumps to expose the conductive layer surrounding the electrical connection pads, and removing the exposed conductive layer; forming an adhesive layer to cover the exposed surfaces of the electrical connection pads and the metal bumps, and removing the second resist layer, the first resist layer and the conductive layer covered by the first resist layer; forming an insulating protective layer over the adhesive layer on the circuit board; and removing a portion of the insulating protective layer to expose a portion of the adhesive layer, so as to form the electrical connector structure of the circuit board. In one embodiment, metal bumps may be made of a material selected from the group consisting of copper (Cu), tin (Sn), silver (Ag), lead (Pb) and their alloys; an adhesive layer may be made of a material selected from the group consisting of copper (Cu), tin (Sn), lead (Pb), silver (Ag), nickel (Ni), gold (Au), platinum (Pt), and their alloys, or a material selected from at least one of phosphorus (P) and solder material.

In accordance with aforementioned fabricating method of the present invention, an electrical connector structure of a circuit board is fabricated and comprising: an electrical connection pad formed on an insulating layer of the circuit board; a metal bump formed on the electrical connection pad; and an adhesive layer for covering the electrical connection pad and the metal bump, wherein an insulating protective layer is further formed on a surface of the circuit board, with a portion of the adhesive layer being exposed from the insulating protective layer.

Compared with the conventional fabricating techniques, the conductive layer, the first and second patterned resist layers are formed before forming the electrical connection pads and the metal bump formed on the electrical connection pads in sequence on the circuit board. Then, the openings are formed in the first layer and the second resist layer at position corresponding to the electrical connection pads and the metal bumps, and the exposed conductive layer is removed. Later, the adhesive layer is formed to cover the exposed surfaces of the electrical connection pads and the metal bumps. Subsequently, the second resist layer, the first resist layer and the conductive layer covered by the first resist layer are removed. Then the insulating protective layer is formed over the circuit board and a portion of the adhesive layer is exposed via thinning process, so as to reduce the exposure and developing processes applied to the insulating protective layer. Therefore, problems such as increasing complexity of the fabrication method due to the requirement of high alignment accuracy, when forming the conductive bumps on the electrical connection pads by the conventional electroplating process could be avoided. Further, arrangement as such also provides a solution for providing fine pitch between the conductive bumps in a condition when a low alignment accuracy is required. Moreover, after forming the metal bumps on the electrical connection pads and the adhesive layer on the surfaces of the metal bumps and the electrical connection pads, the insulating protective layer is formed on the circuit board. Then the thinning process is performed to remove a portion of the insulating protective layer to expose a portion of the conductive layer, so as to form the bump structures at even height. Moreover, arrangement of the present invention also solves the following problems: when conductive bumps are formed directly in the openings of the insulating protective layer and the electroplated resist layers by electroplating, it becomes difficult to control the height of conductive bumps; and consequently, when the conductive bumps are electrically connected to external electronic device, a gap may be formed therebetween due to the irregularity of the conductive bumps formed at uneven height, resulting in an insufficient and incomplete electrical connection between the circuit board and external electronic device. Nevertheless, the foregoing drawbacks are avoided in the present invention as above discussed.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention relates to electrical connection structures of semiconductor chips and methods of fabricating the same, and more particularly, relates to an electrical connection structure of a semiconductor chip and a method of fabricating the same. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Preferred embodiments of an electrical connection structure of a semiconductor chip and a method of fabricating the same proposed in the present invention, are described in detail as follows with reference to FIG. 2, FIGS. 3A to 3I and FIG. 4.

Figure 2:
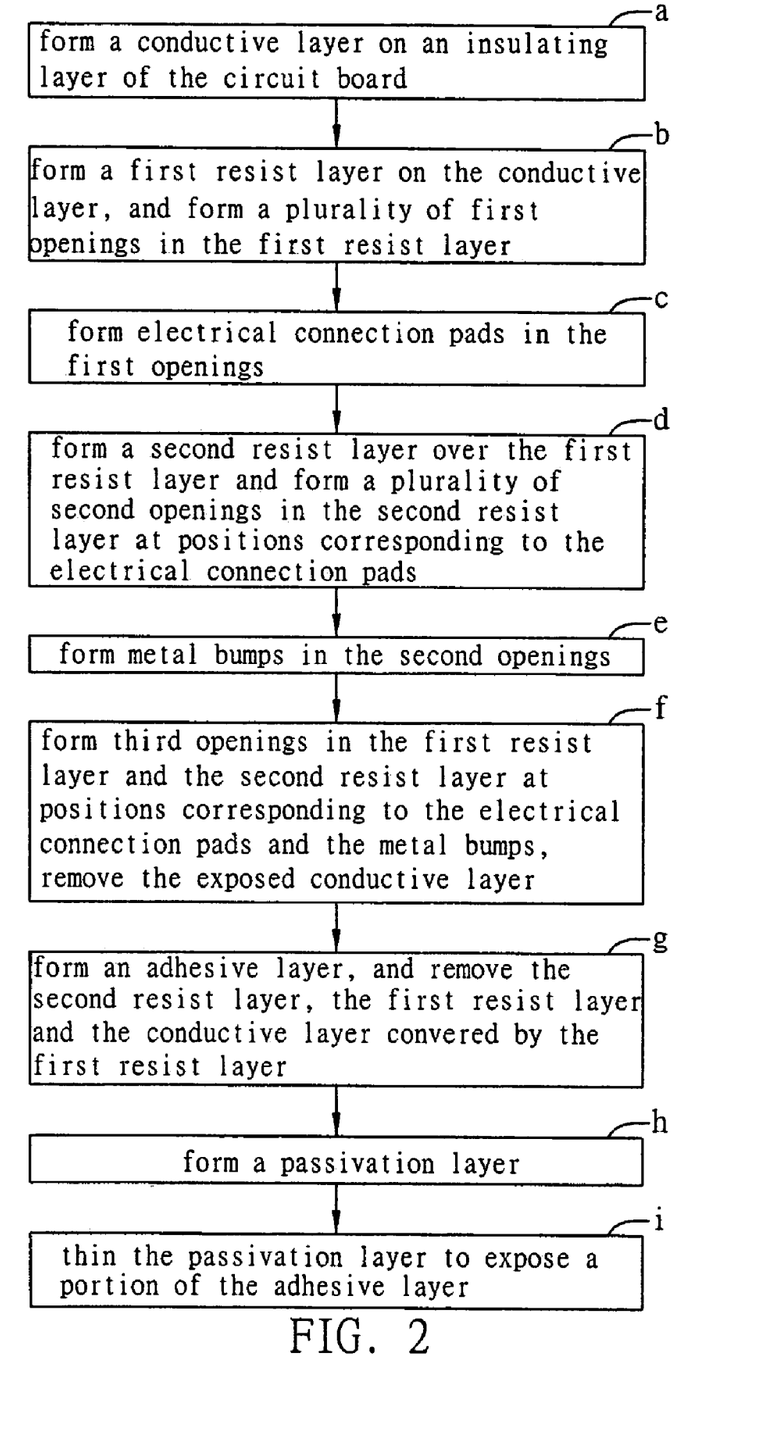
FIG. 2 is a flow chart of a method for fabricating an electrical connection structure of a circuit board of the prevent invention.

Referring to FIG. 2, a flow chart of a method for fabricating an electrical connector structure of a circuit board according to the present invention, is employed to illustrate the embodiments described in the present invention. FIGS. 3A to 3I, are cross-sectional schematic diagrams, showing an electrical connector structure of a circuit board fabricated according to the present invention. However, it is to be noted that these drawings are schematic diagrams only used to demonstrate the fundamental structure of the present invention.

As shown in FIG. 2, for fabricating an electrical connector structure of a circuit board according to the present invention comprises steps of: forming a conductive layer 20 on an insulating layer 21 of the circuit board; forming a first resist layer 22 on the conductive layer 20, and forming a plurality of first openings 220 in the first resist layer 22 to expose a portion of the conductive layer 20; forming electrical connection pads 23 in the first openings 220; forming a second resist layer 24 over the electrical connection pads 23 and the first resist layer 22, and forming a plurality of second openings 240 in the second resist layer 24 at positions corresponding to the electrical connection pads 23 to expose the electrical connection pads 23 via the second openings 240; forming metal bumps 25 in the second openings 240; forming third openings 26 in the first resist layer 22 and the second resist layer 24 at positions corresponding to the electrical connection pads 23 and the metal bumps 25 to expose the conductive layer 20 surrounding the electrical connection pads 23, and removing the exposed conductive layer 20; forming an adhesive layer 27 to cover the exposed surfaces of the electrical connection pads 23 and the metal bumps 25, and removing the second resist layer 24, the first resist layer 22 and the conductive layer 20 covered by the first resist layer 22; forming an insulating protective layer 28 over the adhesive layer 27 on the circuit board; and removing a portion of the insulating protective layer 28 to expose a portion of the adhesive layer 27, so as to form the electrical connector structure of the circuit board.

Figure 3A:
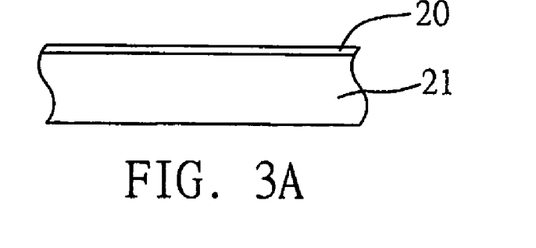
FIGS. 3A to 3I are cross-sectional views of an electrical connection structure of a circuit board according to the present invention.

Referring to FIG. 2, in conjunction with FIG. 3A, the conductive layer 20 is formed on the insulating layer 21 of the circuit board, wherein the insulating layer 21 serves as the most outer insulating layer of the circuit board. The insulating layer 21 may be a material selected from the group consisting of epoxy resin, polyimide, cyanate ester, glass fiber, bismaleimide triazine (BT) and glass reinforced epoxy (FR5). Further, the conductive layer 20 may be made of metals or any conductive molecular material such as a conductive polymer, and serve as an electrically conducting pathway, for instance, an electric current transmission pathway, for subsequent electroplating process.

Figure 3B:
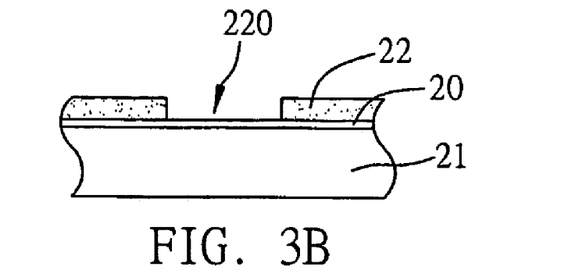

Referring to FIG. 2, in conjunction with FIG. 3B, the first resist layer 22 is formed on the conductive layer 20, and a plurality of openings 220 are formed in the first resist layer 22 to expose a portion of the conductive layer 20. The first resist layer 22 may be formed on the conductive layer 20 by printing, spin-coating or attaching. The first resist layer 22 may be made of photosensitive or non-photosensitive materials, and is preferably made of dry film or liquid photo-resist materials. Further, a plurality of first openings 220 of the first resist layer 22 may be formed via exposure and developing or laser drilling, in order to expose a portion of the conductive layer 20.

Figure 3C:
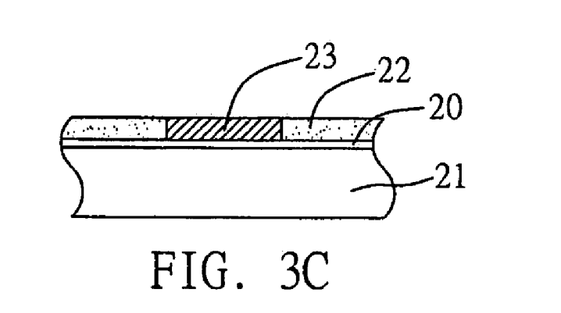

Referring to FIG. 2, in conjunction with FIG. 3C, the electrical connection pads 23 are formed in the first openings 220 via electroplating. Further, a wiring layer may also be formed simultaneously during the formation of electrical connection pads 23. Since the wiring layer is not a technical feature of the present invention, it is therefore not further described or illustrated hereinafter.

Figure 3D:
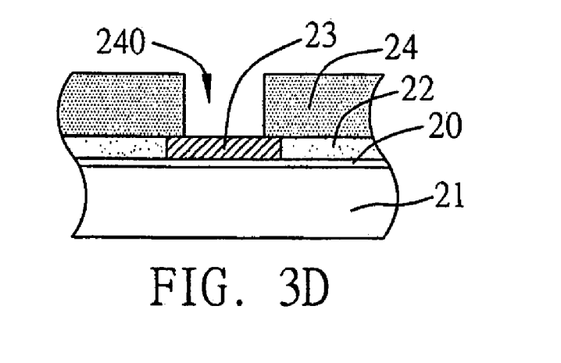

Referring to FIG. 2, in conjunction with FIG. 3D, the second resist layer 24 is formed over the electrical connection pads 23 and the first resist layer 22, and a plurality of second openings 240 are formed in the second resist layer 24 at positions corresponding to the electrical connection pads 23 via exposure and developing or laser drilling to form the second openings 240, wherein the second resist layer 24 may be formed by printing, spin-coating or mounting. The second resist layer 24 may be made of materials as same as the first resist layer 22 such as photosensitive or non-photosensitive materials, or not; however it is preferably made of dry film or liquid photo-resist materials. Further, the second openings 240 of the second resist layer 24 at positions corresponding to the electrical connection pads 23, may be formed via exposure and developing or laser drilling, so as to expose the electrical connection pads 23. Furthermore, the size of the second openings 240 are, preferably, smaller than the size of the first openings 220 of the first resist layer 22.

Figure 3E:
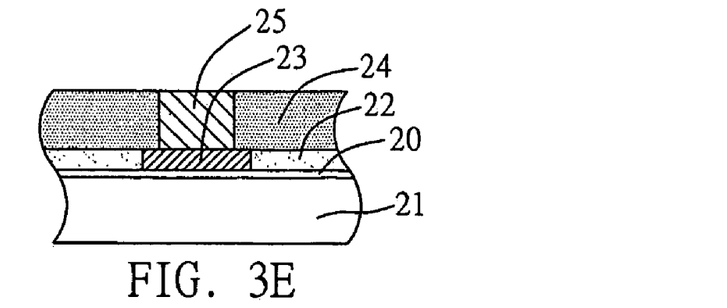

Referring to FIG. 2, in conjunction with FIG. 3E, the metal bumps 25 are formed in the second openings 240 via electroplating, wherein the metal bumps 25 may be made of a material selected from the group consisting of copper (Cu), tin (Sn), sliver (Ag) and lead (Pb) or their alloys. However, according to the experiences from practical implementations, it is noted that copper is, but not limited to, the most preferable material for fabricating metal bumps via electroplating.

Figure 3F:
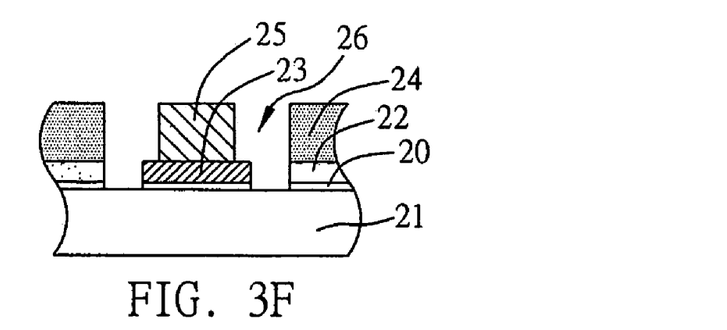

Referring to FIG. 2, in conjunction with FIG. 3F, the third openings 26 are formed in the first layer 22 and the second resist layer 24 at position corresponding to the electrical connection pads 23 and the metal bumps 25 to expose the conductive layer 20 surrounding the electrical connection pads 23, so as to remove the exposed conductive layer 20. The third openings 26 may be formed via plasma etching or laser drilling, and the exposed conductive layer 20 may be removed via one of plasma etching, laser drilling and chemical etching.

Figure 3G:
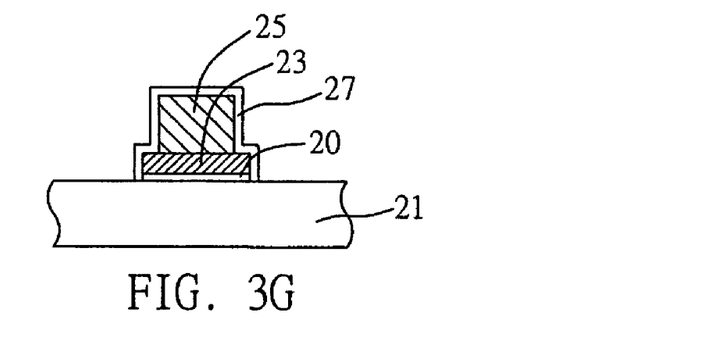

Referring to FIG. 2, in conjunction with FIG. 3G, the adhesive layer 27 is formed to cover the exposed surfaces of the electrical connection pads 23 and the metal bumps 25 via physical or chemical depositing. The second resist layer 24, the first resist layer 22 and the conductive layer 20 covered by the first resist layer 22 are removed via one of chemical stripping and physical tearing. Further, the adhesive layer 27 may be made of the group consisting of copper (Cu), tin (Sn), lead (Pb), silver (Ag), nickel (Ni), gold (Au), platinum (Pt), their alloys, phosphorus (P) and solder materials.

Figure 3H:
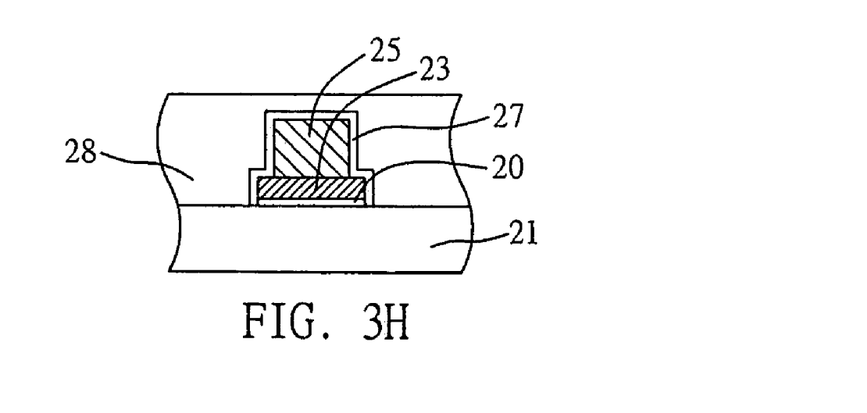

Referring to FIG. 2, in conjunction with FIG. 3H, the insulating protective layer 28 (so called solder mask layer) is formed over the adhesive layer 27 on the circuit board, and is preferably formed by green paint.

Figure 3I:
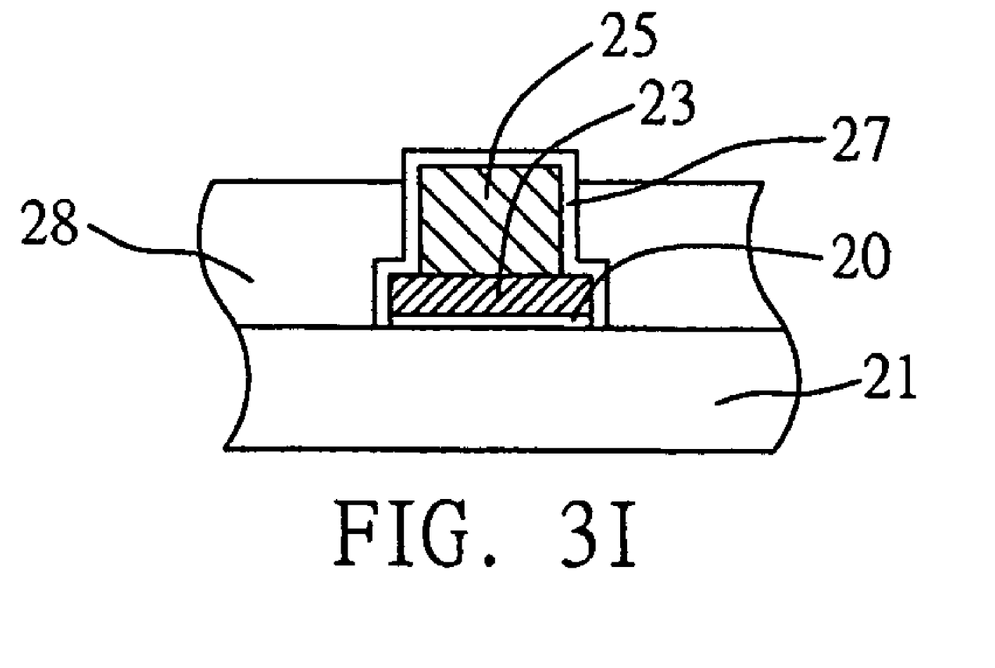

Referring to FIG. 2, in conjunction with FIG. 3I, the exposed portion of the insulating protective layer 28 is removed via thinning process such as polishing or plasma cleaning to expose a portion of the adhesive layer 27, so as to form the electrical connector structure for electrically connecting to external devices.

As aforementioned, one of the technical feature of the present invention is to perform the exposing process, just once, after the formation of the electrical connection pads 23, so as to meet the requirement of exposure accuracy and to avoid problems of having restricted accuracy exposure resulted from second exposure and high cost of production, due to the conventional fabricating technique. Further, as above discussed, a portion of the insulating protective layer 28 is removed via polishing or plasma cleaning to provide a flat surface, so that subsequent processes such as connecting or mounting with electronic devices could be preformed smoothly.

The present invention also provides an electrical connector structure of a circuit board fabricated according to the present invention, comprising: an electrical connection pad 23 formed on an insulating layer 21 of the circuit board; a metal bump 25 formed on the electrical connection pad 23; and an adhesive layer 27 for covering the electrical connection pad 23 and the metal bump 25, wherein an insulating protective layer 28 is further formed on a surface of the circuit board, with a portion of the adhesive layer 27 being exposed from the insulating protective layer 28.

Figure 4:
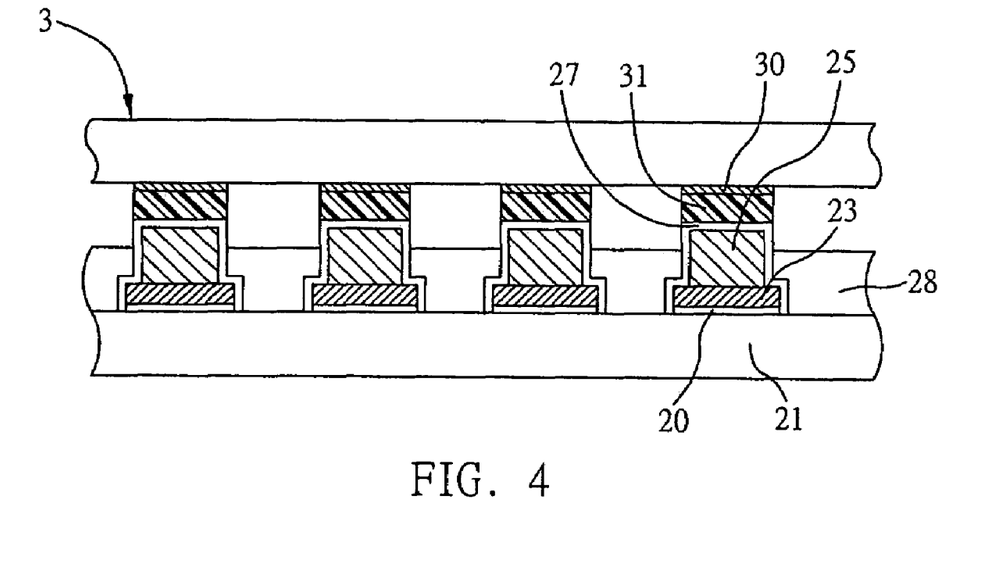
FIG. 4 is a cross-sectional schematic diagram of a semiconductor chip electrically connected to a circuit board through electrical connectors of the circuit board by flip chip technique.

FIG. 4 is a cross-sectional schematic diagram of a semiconductor chip electrically connected to a circuit board through electrical connectors of the circuit board by flip chip technique. A surface of the semiconductor chip 3 formed with a plurality of electrode pads 30 are mounted and electrically connected to the electrical connectors of the circuit board through conductive soldering material 31, wherein the conductive soldering material 31 may be a solder material.

Accordingly, as described above, the conductive layer, the first and second patterned resist layers are employed for forming the electrical connection pads and the metal bumps are formed on the electrical connection pads in sequence on the circuit board. Then, the openings are formed in the first layer and the second resist layer at position corresponding to the electrical connection pads and the metal bumps, and the exposed conductive layer is removed. Later, the adhesive layer is formed on the electrical connection pads, the metal bumps and exposed surfaces of the conductive layer. Subsequently, the second resist layer, the first resist layer and the conductive layer covered by the first resist layer are removed. Then the insulating protective layer is formed over the circuit board and a portion of the adhesive layer is exposed via thinning process, so as to reduce the exposure and developing processes applied to the insulating protective layer. Therefore, problems such as increasing complexity of the fabrication method due to the requirement of high alignment accuracy, when forming the conductive bumps on the electrical connection pads by the conventional electroplating process could be avoided. Further, arrangement as such also provides a solution for providing fine pitch between the conductive bumps in a condition when a low alignment accuracy is required. Moreover, after forming the metal bumps on the electrical connection pads and the adhesive layer on the surfaces of the metal bumps and the electrical connection pads, the insulating protective layer is formed on the circuit board. Then the thinning process is performed to remove a portion of the insulating protective layer to expose a portion of the adhesive layer, so as to form the bump structures at even height. Moreover, when conductive bumps are formed directly in the openings of the insulating protective layer and the resist layers by electroplating, it becomes difficult to control the height of conductive bumps. Consequently, when the conductive bumps are electrically connected to external electronic device, a gap may be formed therebetween due to the irregularity of the conductive bumps formed at uneven height, resulting in an insufficient and incomplete electrical connection between the circuit board and external electronic device. However, the foregoing drawback could be avoided in the present invention as above discussed.

Drawings of the present invention are only used to demonstrate a portion of electrical connection pads, however, the numbers of electrical connection pads can be reassigned and relocated over the circuit board in accordance with requirement of practical implementation. Further, the fabrications described herein may be applied to a single surface or both top and bottom surfaces of the circuit board. Furthermore, the present invention may be performed for fabricating a second level of electrical components of printed circuit board (PCB).

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An electrical connector structure of a circuit board, comprising:
   an electrical connection pad formed on an insulating layer of the circuit board;
   a conductive layer formed between the electrical connection pad and the insulating layer;
   a metal bump formed on the electrical connection pad;
   an adhesive layer for covering the conductive layer, the electrical connection pad and the metal bump; and
   an insulating protective layer formed on the circuit board, wherein a portion of the adhesive layer corresponding to the metal bump is exposed from the insulating protective layer.

2. The electrical connector structure of a circuit board of claim 1, wherein the insulating protective layer is a solder mask.

3. The electrical connector structure of a circuit board of claim 1, wherein the metal bump is made of a material selected from the group consisting of copper (Cu), tin (Sn), silver (Ag), and lead (Pb).

4. The electrical connector structure of a circuit board of claim 1, wherein the adhesive layer is made of a material selected from the group consisting of copper (Cu), tin (Sn), lead (Pb), silver (Ag), nickel (Ni), gold (Au), and platinum (Pt).

5. The electrical connector structure of a circuit board of claim 1, wherein the adhesive layer is made of one of phosphorus (P) and a solder material.

* * * * *